(12) United States Patent
Alsop

(10) Patent No.: US 6,252,403 B1
(45) Date of Patent: Jun. 26, 2001

(54) SPIRAL VOLUME COIL FOR IMPROVED RADIO FREQUENCY FIELD HOMOGENEITY AT HIGH STATIC MAGNETIC FIELD STRENGTH

(75) Inventor: David C. Alsop, Cherry Hill, NJ (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 09/294,514

(22) Filed: Apr. 20, 1999

Related U.S. Application Data

(60) Provisional application No. 60/082,553, filed on Apr. 21, 1998.

(51) Int. Cl.[7] .................................................. G01V 3/00

(52) U.S. Cl. ............................ 324/318; 324/322; 324/300

(58) Field of Search .................................. 324/318, 307, 324/300, 322

(56) References Cited

U.S. PATENT DOCUMENTS 4,703,267 * 10/1987 Maudsley .............................. 324/307
5,621,322 * 4/1997 Ehnholm .............................. 324/318

OTHER PUBLICATIONS

Hoult, et al., "The Sensitivity of the Zeugmatographic Experiment Involving Human Samples" *J. Magn. Reson.*, vol. 34, pp. 425–433 (1979).

Ogawa et al. "Oxygenation–Sensitive Contrast in Magnetic Resonance/Imaging of Rodent Brain at High at High Magnetic Fields" *Magn. Reson. Med.*, vol. 14, pp. 68–78 (1990).

Vaughan, et al. "High Frequency Volume Coils for Clinical NMR Imaging and Spectroscopy", *Magn. Reson. Med.* vol. 32 pp. 206–218 (1994).

Wen, et al., "The Design and Test of a New Volume Coil for High Field Imaging", *Mag. Reson. Med.*, vol. 32, pp. 492–498 (1994).

Ugurbil et al. "Imaging at High Magnetic Fields: Initial Experiences at 4T," *Magnetic Resonance Quarterly*, vol. 9, pp. 259–277 (1993).

Lee, et al. "High Contrast and Fast Three–Dimensional Magnetic Resonance Imaging at High Fields" *Magn. Reson. Med.*, vol. 34, pp. 308–312 (1995).

Bottomly, et al. "RF Magnetic Field Penetration, Phase Shift and Power Dissipation in Biological Tissue: Implications for NMR Imaging", *Physics in Medicine and Biology*, vol. 23, pp. 630–643 (1978).

Foo, et al. "Reduction of RF Penetration Effects in High Field Imaging" *Magn. Reson. Med.* vol. 23, pp. 287–301 (1992).

Foo, et al. "Reduction of RF Penetration Effects in High Field Imaging" *Magn. Reson. Med.* vol 21, pp. 166–177.

Wen, et al. "The Evaluation of Dielectric Resonators Containing $H_2O$ or $D_2O$ as RF Coils for High–Field MR Imaging and Spectroscopy," *Journal of Magnetic Resonance Series B*, vol. 110, pp. 117–123 (1993).

(List continued on next page.)

Primary Examiner—Christine Oda
Assistant Examiner—Brij B. Shrivastav
(74) Attorney, Agent, or Firm—Woodcock Washburn Kurtz Mackiewicz & Norris LLP

(57) ABSTRACT

A spiral coil design can reduce or eliminate inhomogeneities caused by finite wavelength effects at high magnetic field strength. The spiral radio frequency coil has a center axis and angled conductors in a spiral geometry about the center axis, where the phase of current within the conductors varies with axial distance along the center axis of the coil and rotation of the conductors as a function of axial distance along the center axis leads to a phase rotation of a radio frequency field generated by the radio frequency coil when current is applied to the conductors. The amount of phase rotation is determined by the tightness of the spiral of the conductors.

9 Claims, 5 Drawing Sheets

OTHER PUBLICATIONS

Hayes, et al. "An Efficient, Highly Homogeneous Radio-frequency Coil for Whole-Body NMR Imaging at 1.51", *Journal of Magnetic Resonance,* vol. 63, pp. 622–628.

Sun, Y. & Maciel, G.E., "The Tilted Coil for NMR Experiments", *Journal of Magnetic Resonance,* Series A, vol. 105, pp. 145–150, (1993).

* cited by examiner

SPIRAL VOLUME COIL FOR IMPROVED RADIO FREQUENCY FIELD HOMOGENEITY AT HIGH STATIC MAGNETIC FIELD STRENGTH

CROSS-REFERENCE TO RELATED APPLICATIONS

This application claims priority from U.S. Provisional Patent Application Ser. No. 60/082,553, filed Apr. 21, 1998, the contents of which are hereby incorporated by reference.

BACKGROUND OF THE INVENTION

1. Field of the Invention

The present invention relates to a radio frequency coil for use with a magnetic resonance (MR) imaging device and, more particularly, to a spiral volume radio frequency coil which eliminates much or all of the spatial variation in the intensity and contrast of MR images caused by the short wavelengths in high static magnetic fields without compromising performance.

2. Description of the Prior Art

Higher static magnetic field strength can increase the sensitivity of magnetic resonance imaging and spectroscopy studies. As noted by D. I. Hoult et al. in an article entitled: "The Sensitivity of the Zeugmatographic Experiment Involving Human Samples," *J. Magn. Reson.*, Vol. 34, pp. 425–433 (1979), the signal-to-noise ratio of a study increases roughly linearly with magnetic field strength for large samples and even faster for small ones. As noted by Ogawa et al. in an article entitled: "Oxygenation-sensitive contrast in magnetic resonance imaging of rodent brain at high magnetic fields," *Magn. Reson. Med.*, Vol. 14, pp. 268–78 (1990), image contrast can also be increased, especially with susceptibility based contrast mechanisms such as blood oxygenation contrast. Spectroscopy studies may benefit from greater spectral resolution because $T_2$ changes only slowly with frequency. Despite these advantages, a number of technical obstacles have impeded the progress of high field MR in human subjects. Though static field inhomogeneity, longer $T_1$, and power deposition are important issues, the primary obstacle has been radio frequency (RF) coil technology.

At frequencies above 100 MHZ, the decreasing RF wavelength becomes a serious problem. Even in the absence of a sample, problems with phase shifts, parasitic capacitance and radiative losses complicate the construction of RF coils. Fortunately, recent work by J. T. Vaughan et al. in an article entitled: "High Frequency Volume Coils For Clinical NMR Imaging and Spectroscopy," *Magn. Reson. Med.*, Vol. 32, pp. 206–218 (1994), and by H. Wen et al. in an article entitled: "The Design and Test of a New Volume Coil for High Field Imaging," *Magn. Reson. Med.*, Vol. 32, pp. 492–498 (1994), has demonstrated that distributed capacitance, careful design and the use of RF shields can overcome these coil construction problems. Most high field volume coil designs have attempted to achieve the low frequency ideal of a sinusoidally distributed current with negligible phase shift along the axis of the coil. Imaging studies and simulations have shown, however, that this type of coil produces higher RF field in the center of the sample than towards the outside. With this degree of RF inhomogeneity, the sensitivity at the outside of the sample may not be substantially improved over lower field images with better homogeneity. Contrast and image intensity with many pulse sequences will also vary with position, making them less easily interpretable. Often high field imaging results have employed special pulse sequences of the type disclosed by Vaughan et al. in the afore-mentioned article, by Ugurbil et al. in an article entitled: "Imaging at High Magnetic Fields: Initial Experiences at 4T," *Magnetic Resonance Quarterly*, Vol. 9, pp. 259–277 (1993), and by J. H. Lee et al. in an article entitled: "High Contrast and Fast Three-Dimensional Magnetic Resonance Imaging at High Fields," *Magn. Reson. Med.*, Vol. 34, pp. 308–312 (1995), which are chosen to minimize intensity variations from RF inhomogeneity.

As noted by Bottomley et al. in an article entitled: "RF Magnetic Field Penetration, Phase Shift and Power Dissipation in Biological Tissue: Implications for NMR Imaging," *Physics in Medicine and Biology*, Vol. 23, pp. 630–643 (1978), two factors lead to decreased RF field homogeneity within samples at high field strength. One factor is the shorter penetration distance, or skin depth, of RF into the sample because of electrical conductivity. This skin depth decreases approximately as the square root of the frequency, or field strength. As the skin depth decreases, the field should become weaker at the center of the sample. The second factor affecting field homogeneity is the short wavelength of light in the sample. Because of the high dielectric constant of water and tissue at these frequencies, the wavelength of light is almost eight times shorter in the sample than in air. This short wavelength implies that the amplitude or phase of the RF must vary with position inside the sample. The center brightening of high field images is a natural consequence of this requirement for spatial variation of RF.

While spatial variation of the amplitude of the RF field complicates MR studies, spatial variation of the phase of the RF is relatively benign. As long as the phase variation within an imaging or spectroscopic voxel, typically much smaller than the sample, is much less than 180°, the results will be unaffected. A coil designed to produce a spatially varying RF phase but a spatially uniform RF magnitude could provide a practical solution to the problem of high field RF inhomogeneity. In an article entitled: "Reduction of RF Penetration Effects in High Field Imaging," *Magn. Reson. Med.*, Vol. 23, pp. 287–301 (1992), Foo et al. first emphasized the value of a cylindrical coil which produces a linear phase variation along its axis for improved RF homogeneity at high field. Foo et al. were able to produce this phase variation in a coil by driving a traveling wave from one end of a dielectric filled coil and absorbing it resistively at the other. The absorption was necessary because reflection of the traveling waves would cause standing wave patterns with very poor axial field homogeneity. Though improved spatial homogeneity of the RF was observed, the resistive termination made the coil extremely inefficient and unacceptable for practical use.

A previous attempt to improve the spatial uniformity of high field imaging was published in *Magnetic Resonance in Medicine*, Vol. 23, pp. 287–301 (1992). In that article, it was recognized that a volume coil which produced a linear phase variation along its axis would improve the image uniformity. However, no practical coil to achieve this was described.

Other coils for high field strength head imaging have been reported in *Magn. Reson. in Med.*, Vol. 32, pp. 206–218 and pp. 492–498 (1994). However, neither of the described coils attempts to improve the image uniformity. In addition, a coil that produces a linear phase variation was constructed and reported in *Magn. Reson. Med.*, Vol. 23, pp. 287–301 (1992), but the coil used dielectrics and resistive terminators in a way that reduce the S/N ratio by orders of magnitude. Images were never acquired with the coil as a result.

Finite wavelength effects in the sample cause the RF produced by standard cylindrical MR volume coils to be greater in magnitude at the center than towards the outside of the sample. For many pulse sequences, the inhomogeneity of the RF field leads to center brightening of images as well as large variations of signal to noise ratio and contrast throughout the image. Since the wave equation requires that there be spatial variation of the RF field, inhomogeneity of the RF field is unavoidable. However, spatial variation can be present without affecting most MR images if the magnitude of the RF field is constant while only the RF phase varies with position. This principle was emphasized by Foo et al., who recognized that a cylindrical volume coil that generated a linear phase shift along its axis could eliminate the magnitude inhomogeneity in the RF field. However, to the inventor's knowledge, a practical coil for achieving this field distribution has not yet been presented.

A spiral coil has been used for a different purpose, namely, for tuning the coil simultaneously to two frequencies. However, the use of a spiral coil to produce a linear phase variation along its axis in high magnetic field strengths is not known to the inventor.

Accordingly, it is known in the art that increased magnetic field strength improves the sensitivity and some forms of contrast in MRI. As the field is increased, the frequency of the MR signal increases proportionally. At field strengths above 1.5 Tesla, the wavelength of the radio frequency signal inside of biological samples becomes shorter than the size of the human head and body. Such short wavelengths tend to cause variations with position in the intensity and contrast of the MR images. In many parts of the head or body, the improved image quality of high field is not realized because of these spatial variations. A high RF frequency field coil design that addresses these problems and realizes a linear phase variation along its axis while preserving efficiency and field homogeneity along its axis is not known in the art. The present invention has been developed to address this need in the art.

SUMMARY OF THE INVENTION

The present invention relates to a method of using a spiral radio frequency (RF) coil to reduce the spatial non-uniformity of the RF amplitude in large samples, such as the human body, when imaged with magnetic resonance (MR) at high static magnetic field strengths. Spatial non-uniformity causes undesirable variations in contrast and sensitivity across an MR image. This spatial non-uniformity of RF is a natural consequence of the short wavelength of electromagnetic waves in tissue at the RF frequencies employed for MR imaging at high magnetic field strengths.

In particular, the invention relates to a method of using a spiral RF coil to create a spatial variation of RF phase which can increase the uniformity of the RF amplitude. In the currently preferred implementation of this device, the phase variation is a linear variation of phase with position along the central axis of the coil, but other embodiments might modify this phase variation to optimize for certain shapes of sample or for ease of construction.

The invention involves using an RF coil geometry similar to the standard cylindrical or elliptical "birdcage" coils widely used in MR imaging. The invention differs from a birdcage coil in that the straight axial conductors of the birdcage coil are replaced by conductors which deviate from parallel to the axis of the coil. The currently preferred implementation employs conductors at a fixed angle relative to the axis, which produces a spiral appearance. These angled conductors produce phase variations in the RF fields inside the sample which can reduce the spatial non-uniformity of the RF magnitude when the angle is optimal.

BRIEF DESCRIPTION OF THE DRAWINGS

The foregoing and other novel features and advantages of the invention will become more apparent and more readily appreciated by those skilled in the art after consideration of the following description in conjunction with the associated drawings, of which.

DETAILED DESCRIPTION OF THE PRESENTLY PREFERRED EMBODIMENTS

A preferred embodiment of the invention will now be described in detail with reference to FIGS. 1–5. Those skilled in the art will appreciate that the description given herein with respect to those figures is for exemplary purposes only and is not intended in any way to limit the scope of the invention. All questions regarding the scope of the invention may be resolved by referring to the appended claims.

Materials and Methods

Coil Construction

Figure 1:
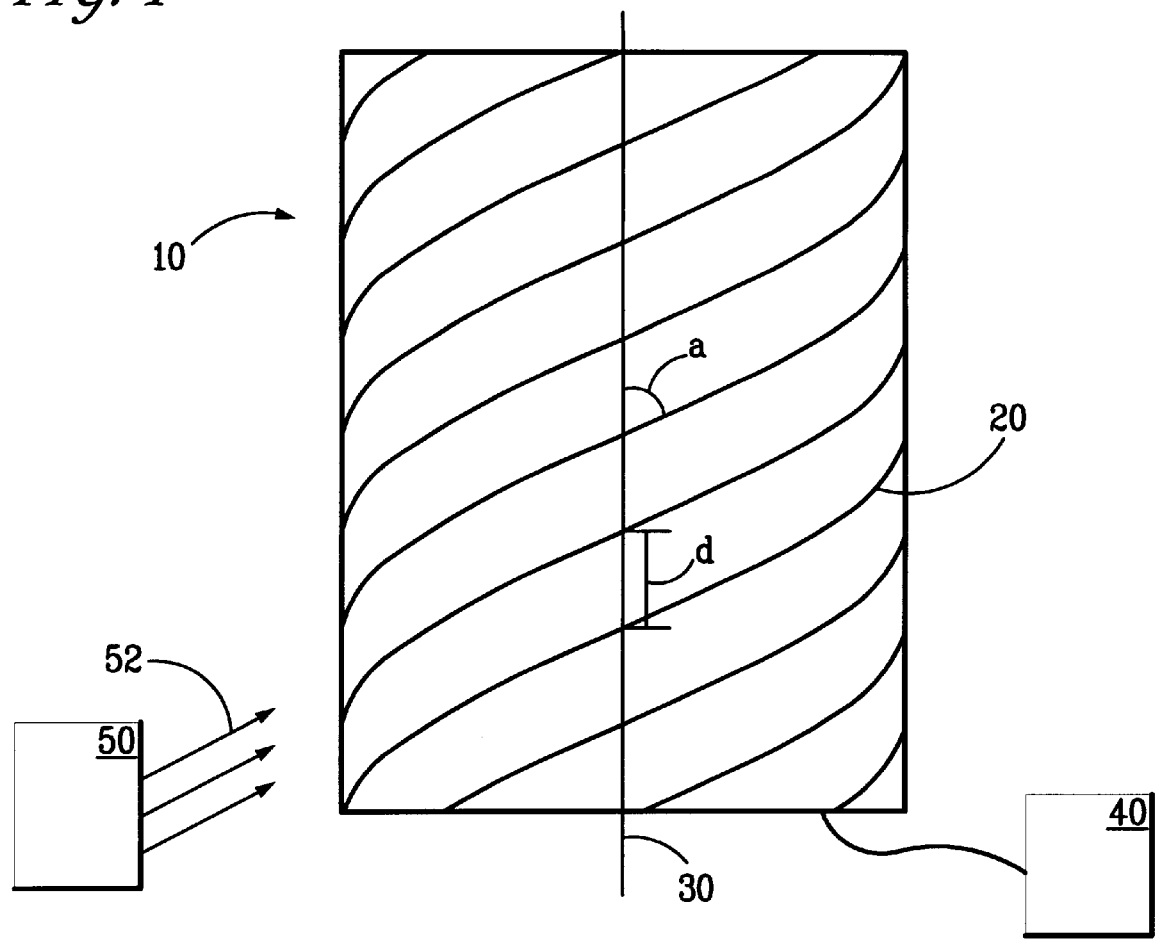
FIG. 1 illustrates a spiral RF coil in accordance with the invention. In contrast with the birdcage coil, where the conductors are straight axial segments, the conductors of the spiral coil of the invention are twisted around the circumference.

FIG. 1 illustrates a spiral RF coil 10 in accordance with the invention. In contrast with a birdcage coil, where the conductors are straight axial segments, the conductors 20 of the spiral coil of the invention are twisted around the circumference of the coil 10, at an orientation angle, a, relative to a center axis 30. The conductors 20 are spaced apart from one another by a distance, d, measured along the center axis 30. The "tightness" of the coil can be varied by adjusting the distance between the conductors 20. In general, the angle, a, can vary for each conductor, although in a preferred embodiment, a is fixed for all conductors. The angled conductors produce phase variations in the RF fields inside the sample which can reduce the spatial non-uniformity of the RF magnitude when the angle, a, is optimized.

A magnetic resonance imaging device according to the present invention comprises a cylindrical radio frequency (RF) coil 10 having at least one conductor 20 in a spiral geometry oriented around the center axis 30, and an RF coil driver 40 which applies a current to the coil 10 to produce a radio frequency field having a substantially linear phase variation along the center axis 30. The device can also include a magnetic field generator 50 which generates a high strength magnetic field 52 having a field strength of at least four Tesla.

A practical realization of the spiral coil 10 of the invention has been constructed for experimental evaluation. The spiral coil 10 was constructed on a plastic cylinder of 25 cm inside diameter and 30 cm length. For ease of construction, the spiral elements 20 of the idealized spiral coil were approximated by short discrete axial and circumferential segments. The circumferential segments were constructed from copper tubing of approximately 5 mm diameter cut to length and pressed tightly into grooves machined in the plastic for that purpose. The circumferential elements were joined by shorter axial segments consisting of ceramic capacitors (Dielectric Laboratories, Cazenovia N.Y.) and short lengths of copper wire. Eight circumferential segments, each spanning 45° rotation, and seven axial capacitor segments of 38 mm were used. An RF shield consisting of a thin layer of copper on plastic backing was attached to a second cylindrical plastic form with an outside diameter of 32 cm. The coil was suspended coaxially within the RF shield with plastic screws.

After attempts at driving the coil in quadrature when it was constructed with traditional birdcage end rings failed because of excessive coupling between the two linear modes, the individual conductors were attached to the shield with variable capacitors (Oxley Inc., Los Angeles Calif.). It is known that such shield returns have been successfully employed for high field coils by others skilled in the art. The spiral coil 10 was tuned to 170 MHZ by judicious selection of capacitor values, 6.8 pf, for each of the seven axial segments. The variable capacitors joining the conductor segments to the shield provided only very fine scale adjustment of the frequency over their range of 5–30 pf. Connection to the spiral coil 10 was made with 50 ohm coaxial cable at two points separated by 90° rotation. The outer conductors of the coaxial cables were attached directly to the shield and the inner conductors were attached to the coil conductors 20 at a point between the first and second axial segments through variable capacitors. When the spiral coil 10 was loaded with a human head, the impedance of the coupling capacitor required to match the coil to 50 ohms was nearly zero.

Imaging

Figure 2A:
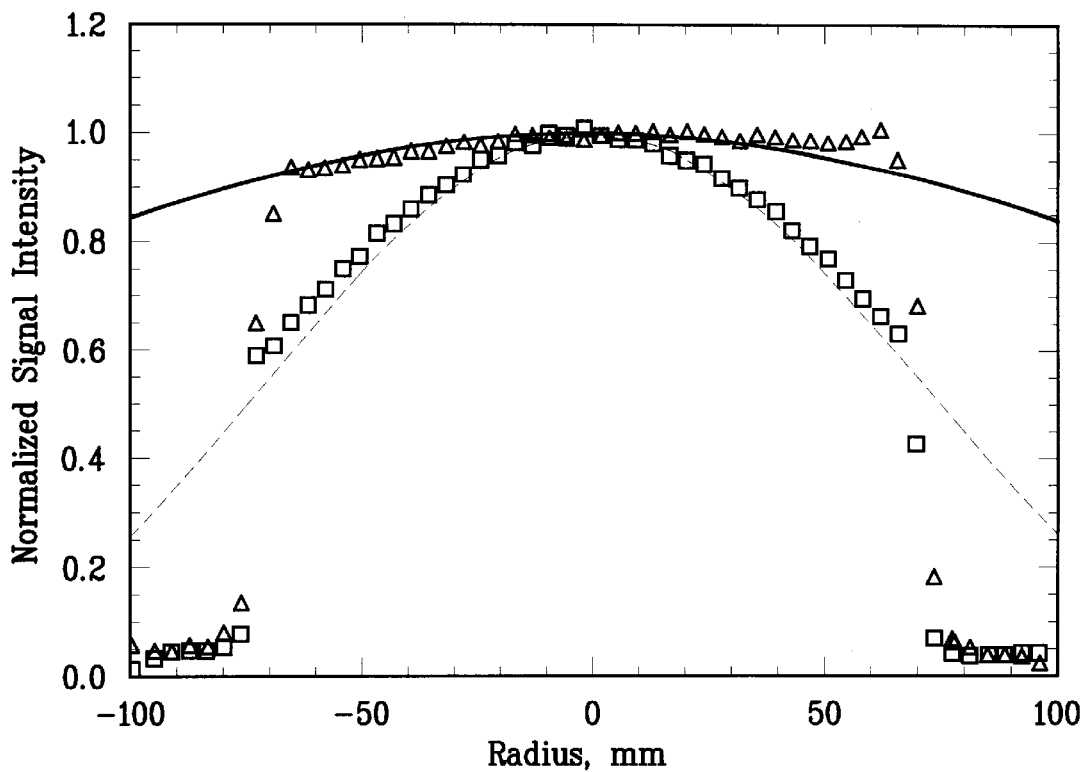
FIGS. 2(a) and 2(b) respectively illustrate profiles of image intensity obtained with the spiral coil of the invention in solid line and a highpass birdcage coil in dashed line for a 100% isopropanol phantom and a 70% isopropanol, 30% $H_2O$ mixture phantom.
Figure 2B:
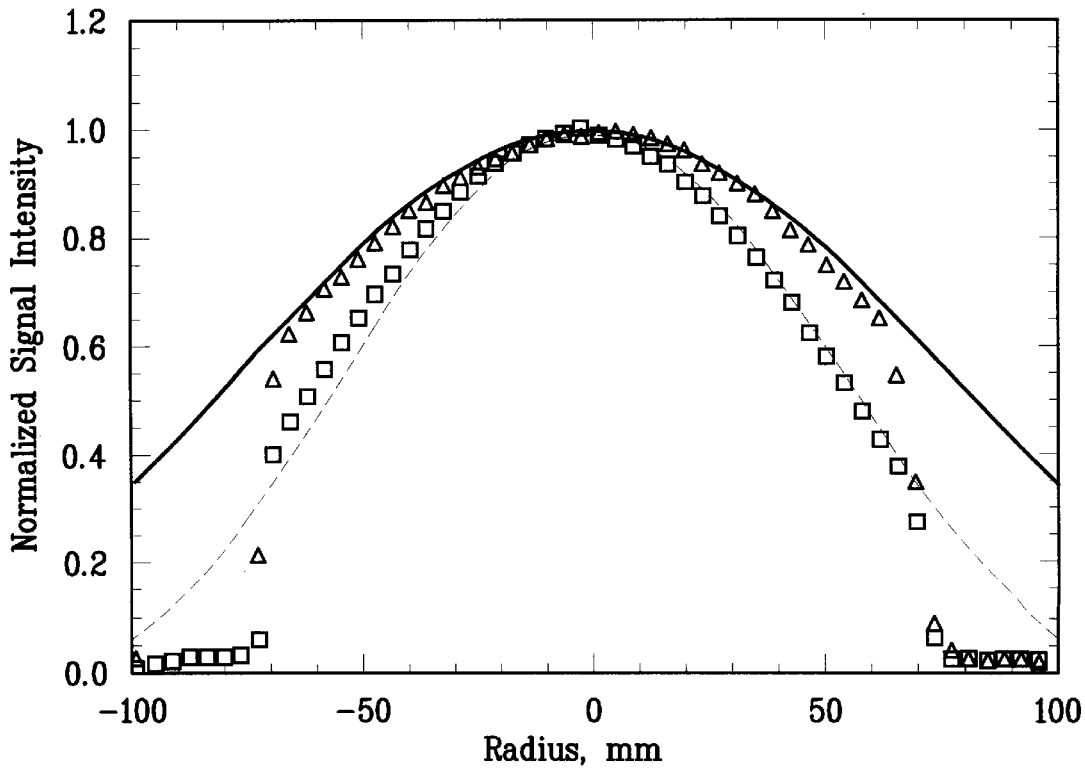

Imaging was performed in a 1 meter bore 4 Tesla magnet (Oxford Magnet Technology Ltd., Oxon UK) equipped with a GE SIGNA (GE Medical Systems, Milwaukee Wis.) console. Images were acquired with a gradient echo sequence with a TR of 500 ms, a TE of 3 ms, and a flip angle of 10° in multiple interleaved slices of 5 mm thickness. With this low flip angle, the signal intensity should depend on the square of the RF field strength. A 24 cm field of view, a 32 kHz bandwidth and a 128×256 matrix were selected. Flip angles were determined with the manufacturer's prescan sequence. When inhomogeneous RF fields are present, the prescan sequence tends to set the RF power so that the areas with the highest RF amplitude experience the correct flip angle. Images were obtained with both the spiral coil 10 and a highpass birdcage coil of 27.5 cm diameter and 38 cm length provided by the manufacturer. Images were first acquired in two phantoms, one containing 100% isopropanol (FIG. 2(a)) and the other 70% isopropanol and 30% H$_2$O (FIG. 2(b)), in approximately cylindrical plastic bottles of 15 cm diameter and 30 cm length. As known by those skilled in the art, 100% isopropanol has a dielectric constant lower than that of water, 18, and the mixture should have a dielectric constant of approximately 36. FIGS. 2(a) and 2(b) respectively illustrate profiles of image intensity obtained with the spiral coil of the invention in solid line and the highpass birdcage coil in dashed line for a 100% isopropanol phantom and a 70% isopropanol, 30% H$_2$O mixture phantom.

Figure 3:
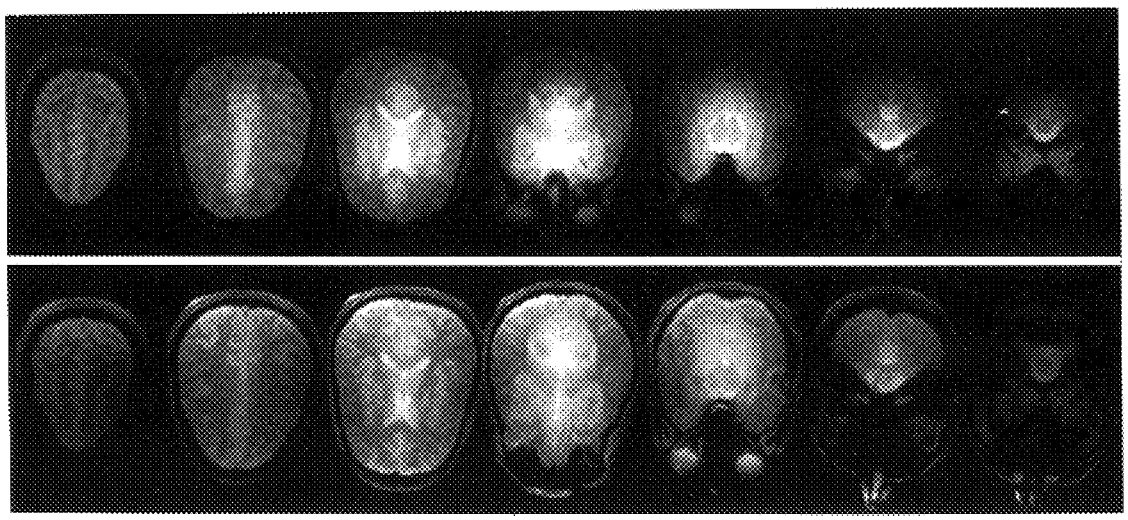
FIG. 3 illustrates seven axial gradient echo images acquired through the brain of a normal volunteer. Images obtained with the spiral coil of the invention (top row) are more homogenous than those obtained with a highpass birdcage coil (bottom row).
Figure 4:
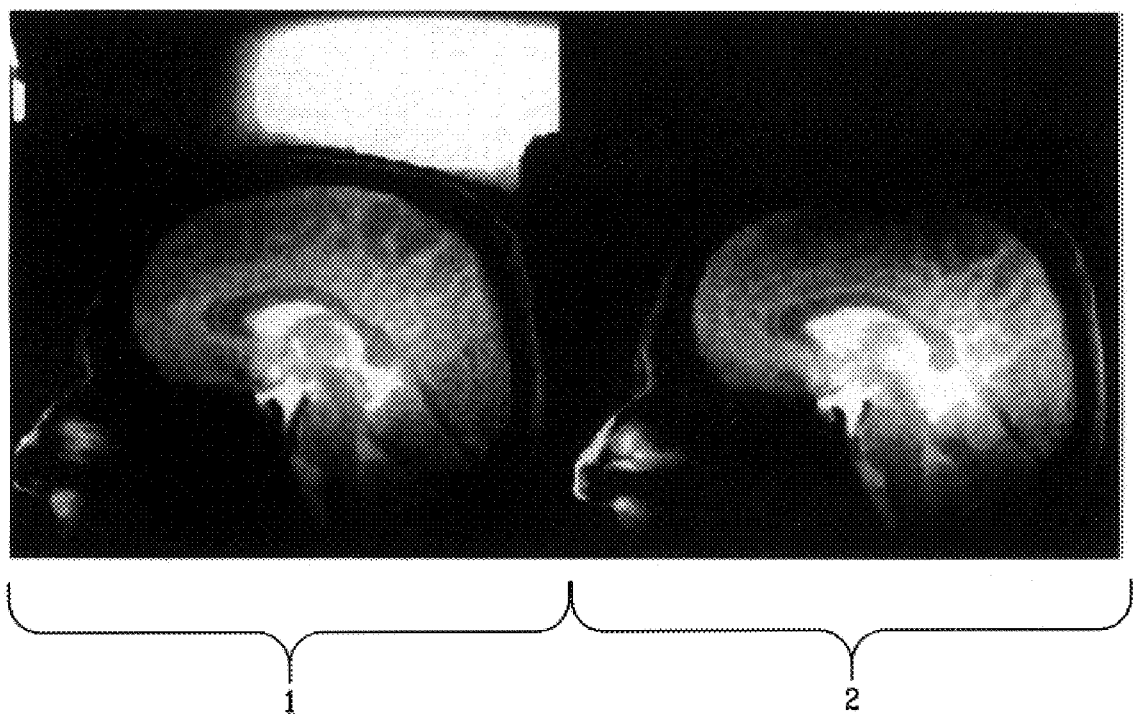
FIG. 4 illustrates a comparison of image intensity homogeneity at the top of the head in the presence (left) and the absence (right) of a bag of $H_2O$ pushed against the top of the head.

FIG. 3 illustrates seven axial gradient echo images acquired through the brain of a normal volunteer. Images obtained with the spiral coil of the invention (top row) are more homogenous than those obtained with the highpass birdcage coil (bottom row). Multi-slice axial images were acquired with identical scan parameters in the two coils. Additional sagittal scans were performed in the spiral coil with and without a plastic bag of water pushed against the scalp of the volunteer as shown in FIG. 4. In particular, FIG. 4 illustrates a comparison of image intensity homogeneity at the top of the head in the presence (left) and the absence (right) of a bag of H$_2$O pushed against the top of the head.

Mathematical Modeling

A model for the magnetic and electric fields produced is necessary to compare coil designs. Following the teachings of Foo et al. in an article entitled: "An Analytical Model for the Design of FR Resonators for MR Body Imaging," *Magn. Reson. Med.*, Vol. 21, pp. 165–177 (1991), the inventor assumed a cylindrical sample and coil of infinite length and used orthogonal function techniques to calculate the fields. The transverse fields, B$_x$ and B$_y$, are solutions of the wave equation and can be expressed as linear combinations of functions $\Omega$ of the form:

$$\Omega_m = R_m e^{i(kz+m\phi-\omega t)}$$

where $$R_m = (C_m I_m(\tilde{k}r) + D_m e^{im\pi} K_m(\tilde{k}r))$$

and $C_m$ and $D_m$ are constants determined by the boundary conditions, r, $\phi$, and z are the cylindrical coordinates, t is time, k is the axial wavenumber, m is an integer, $\omega$ is the angular frequency, I and K are modified Bessel functions, $$\tilde{k} = \sqrt{k^2 - \omega^2 \mu \epsilon - i\omega\mu\sigma}$$

$\mu$ is the permeability, $\epsilon$ is the permitivity and $\sigma$ is the conductivity of the sample. Since circularly polarized fields are of interest for MRI, the inventor expanded the transverse magnetic field in positively and negatively polarized modes:

$$B_m^\pm = \Omega_m \hat{x} \pm i\Omega_m \hat{y}$$

Using Maxwell's equations for the divergence and curl of B one can determine all of the other field components from the transverse field:

$$B_r^\pm = R_m e^{i((m\pm 1)\varphi + kz - \omega t)}$$

$$B_\varphi^\pm = \pm i R_m e^{i((m\pm 1)\varphi + kz - \omega t)}$$

$$B_z^\pm = i\frac{\tilde{k}}{k} R_{(m\pm 1)}^* e^{i((m\pm 1)\varphi + kz - \omega t)}$$

$$E_r^\pm = \pm \left[ \frac{(k^2 + i\omega\mu\sigma + \omega^2\mu\varepsilon)R_m + \tilde{k}^2 R_{m\pm 2}^*}{2k(\mu\sigma - i\omega\mu\varepsilon)} \right] e^{i((m\pm 1)\varphi + kz - \omega t)}$$

$$E_\varphi^\pm = i \left[ \frac{(k^2 + i\omega\mu\sigma + \omega^2\mu\varepsilon)R_m - \tilde{k}^2 R_{m\pm 2}^*}{2k(\mu\sigma - i\omega\mu\varepsilon)} \right] e^{i((m\pm 1)\varphi + kz - \omega t)}$$

-continued $$E_z^\pm = \pm \frac{i\tilde{k}R^*_{(m\pm1)}}{(\mu\sigma - i\omega\mu\varepsilon)} e^{i((m\pm1)\varphi + kz - \omega t)}$$

where the inventor has defined $$R^*_{m\pm n} = (C_m I_{m\pm n}(\tilde{k}r) + D_m e^{i(m\pm n)\pi} K_{m\pm n}(\tilde{k}r))$$

for any integer n. Since only the mode with m=0 is nonzero at the center of the phantom, it is the best candidate for a homogeneous mode. Cylindrical boundary conditions will generally mix the positively polarized m=0 solutions with the negatively polarized m=2 solutions because the fields have the same angular dependence. The relative amplitude and phase of the two solutions determines whether the field is transverse electric (TE), transverse magnetic (TM), or a mixture of the two. Though this negatively polarized m=2 component is invisible, the electric fields of this mode can have a large impact on the total power deposition in the coil. In order to estimate the relative amplitude of the two solutions in a real coil, the inventor imposed model boundary conditions. In the model, the sample has a radius $r_1$, the coil is at radius $r_2$ and a perfectly conducting shield is at $r_3$. The boundary conditions are:

1. All fields must be finite at r=0.
2. $B_r$, $E_z$, and $E_\phi$ must vanish at the shield, r=$r_3$.
3. $B_r$, $B_x$, $B_\phi$, $E_\phi$, $E_z$ must be continuous at the sample boundary, r=$r_1$.
4. $B_r$, $E_\phi$ and $E_z$ must be continuous across the coil, r=$r_2$.
5. The discontinuities in $B_z$ and $B_\phi$ at the coil are determined by the current densities.
6. The ratio of the axial and azimuthal currents is real and determined by the spiral geometry of the coil.

These constraints lead to a system of 12 linear equations which can be inverted numerically by singular value decomposition. A solution can be found for any choice of k, ω, and ratio of azimuthal to axial current on the coil; however, in a practical realization, the reactive impedance of the conductors is an additional boundary condition which will produce modes at only a few discrete values of ω and k.

Field distributions were calculated for coils with k ranging from just above 0 to 10 times the free space wavenumber. For these calculations, $r_1$, $r_2$, and $r_3$ were 75, 125 and 150 mm, respectively, the frequency was 170 MHZ, and a permittivity of 56 times $\epsilon_0$ and a conductivity of 0.67 Siemens were assumed. The calculations were performed with ratios of azimuthal to axial current of k$r_2$, and 1.4 k$r_2$. A ratio of k$r_2$ would be expected if there were no phase variation of the current with distance along the conductors. To compare power deposition in different coils, the square of the electric field was integrated over the sample. The amplitude of the current for each geometry was set to the value required to give a circularly polarized transverse magnetic field of 1 at the center of the sample. When the axial current is zero, the coil will support two modes of positive and negative k which produce a standing wave. Since the transverse electric fields change sign with k, they will be nearly zero at the center of the coil and increase linearly away from the center. This can diminish the power dissipated by the transverse fields in coils that are much shorter than an axial wavelength. Because the axial electric field, which is not zero at the center of the coil, contributes most to the power deposition for the parameters chosen, the transverse fields were not included in the power calculation for the non-spiral coil.

Results

Loading of the coil with the head of a volunteer changed the Q from 288 to 64 indicating a dominant contribution of sample to the coil losses. The extreme load change resulted in a resonant frequency change of less than 0.5 MHZ. The spiral coil electrical properties were very stable with cable placement and no baluns were necessary to eliminate shield currents on the drive cables. The inventor attributes this stability to the excellent ground reference provided by direct attachment of cable shields to the RF shield.

Imaging of the phantoms demonstrated clear differences in RF homogeneity between the birdcage and the spiral coil. As illustrated in FIG. 2(a), the 100% isopropanol phantom image was nearly uniform with the spiral coil 10 but slightly center brightened with the birdcage coil. These results were consistent with an axial wavenumber of nearly zero for the birdcage and approximately four times the free space wavenumber for the spiral coil 10. As shown in FIG. 2(b), images from the isopropanol/water mixture phantom were center brightened for both coils, but the spiral coil 10 images were more homogeneous.

Axial images of the brain from the two coils are compared in FIG. 3. The images using the birdcage coil (bottom row) show much greater brightness at the center of the head and rapid decay of signal with distance from the center. In contrast, the spiral coil 10 images (top row) are much more homogeneous and center brightening is not apparent. A sudden drop of signal is apparent at the top of the head, however. For reasons which will be discussed below, the inventor suspects that the absence of dielectric material above the head was responsible for the loss of signal there. To test this hypothesis, sagittal images were acquired in the spiral coil 10 with the top of the head far from the end of the spiral coil 10 and a plastic bag filled with water pressed against the scalp. The images were repeated after removing the water bag with minimal motion of the subject. As shown in FIG. 4, images without the water bag (right) clearly demonstrate signal loss at the very top of the head but placement of the dielectric water against the scalp (left) eliminated this signal loss.

Figure 5:
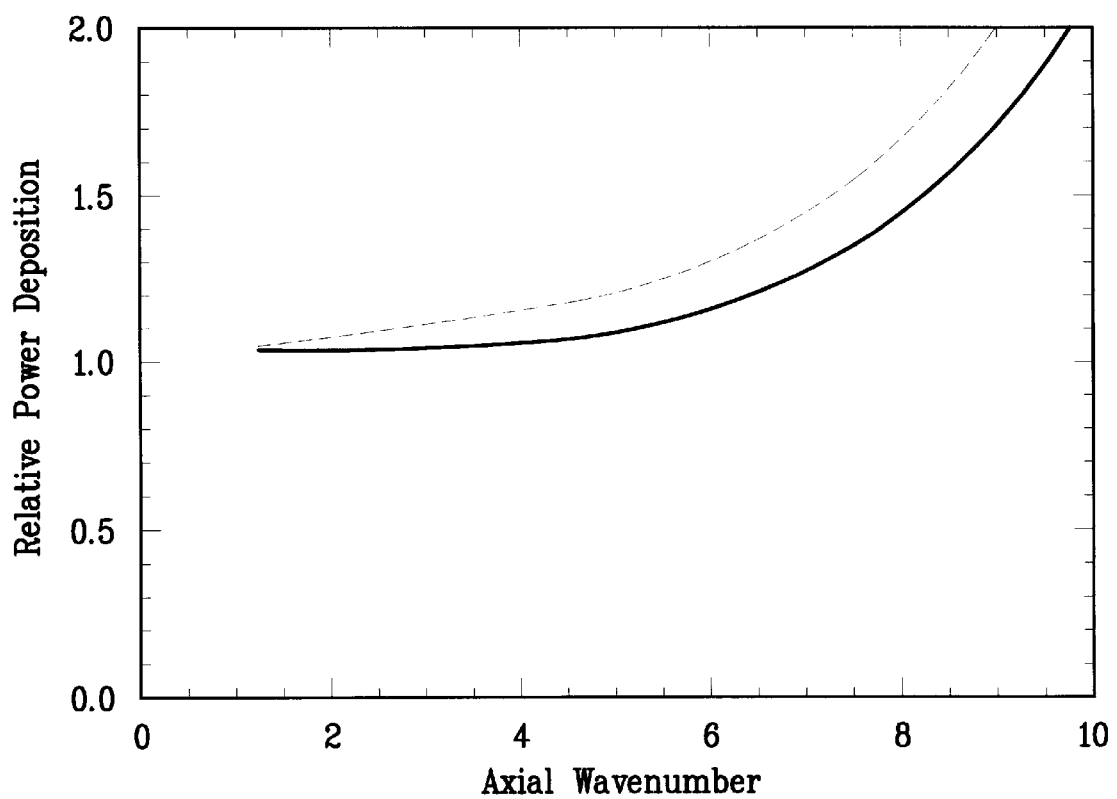
FIG. 5 illustrates the calculated power dissipation per unit length of a spiral coil as a function of the axial wavenumber in units of the free space wavenumber, $\omega/c$, where the results are plotted for ratios of circumferential to axial current of $kr_2$, (solid line) and 1.4 $kr_2$ (dashed line). The power deposition is relative to a straight element coil with wavenumber of one.

The RF power required to achieve an equal flip angle in the brain as determined by the manufacturer's prescan were similar for the two coils. The spiral coil 10 required 0.5 db less power than the birdcage coil but the birdcage coil was slightly longer. The power required for a transverse magnetic field of 100 mG was approximately 240 W. FIG. 5 illustrates the calculated power dissipation per unit length of a spiral coil as a function of the axial wavenumber in units of the free space wavenumber, ω/c, where the results are plotted for ratios of circumferential to axial current of k $r_2$, (solid line) and 1.4*k $r_2$ (dashed line). The power deposition is relative to a straight element coil with wavenumber of one. As illustrated in FIG. 5, the power deposition increases only slightly with axial wavenumber, consistent with the experimental measurements. Since the powers are compared for equal transverse magnetic field at the center, much of the increase in power at higher wavenumbers can be attributed to increased field strengths towards the outside of the cylinder. The field magnitude first becomes more uniform and then ultimately too large at the outer radii as the wavenumber is increased.

Discussion

The experimental results confirmed that the spiral coil 10 can produce more spatially uniform images consistent with a linear variation of phase along the axis 30. The near perfect homogeneity of the isopropanol image obtained with the spiral coil 10 suggests a linear phase variation of approximately four times the free space wavenumber, 0.15 radians/cm. The tightness of the spiral was designed to produce a phase variation of 0.21 radians/cm that would have results in a noticeable darkening of the center of the 100% isopropanol phantom. The design assumed that there would be no phase variation of the current along the conductors and did not account for the short lengths of the coil and sample, which was only 80% of the coil diameter. The weakness of these assumptions may account for the discrepancy between the RF phase gradient and the spiral tightness. Though further work may be necessary to understand precisely the effect of spiral tightness, coil length, frequency, and conductor impedance on the axial wavenumber achieved, the results demonstrate the feasibility of the design.

The initial implementation of the spiral coil 10 demonstrated excellent RF homogeneity in the head that was superior to that of the highpass birdcage coil. This improvement can be attributed to the linear phase variation along the axis. Because other reported coil designs based on the straight axial conductor design should produce similar field patterns as the highpass birdcage, they will have difficulty achieving the homogeneity of the spiral coil. A coil built from straight conductors which produces comparable phase variation to the spiral coil will also create undesirable axial inhomogeneity due to standing waves.

The most noticeable inhomogeneity of the spiral coil images was a drop in signal intensity near the top of the head. Since the spiral coil 10 tends to produce homogeneous fields in samples with approximately infinite cylindrical symmetry, it is not surprising that it performs poorly at the top of the head where the dielectric properties of the material change abruptly. That placing a dielectric above the top of the head was very successful at eliminating the signal loss supports this reasoning. The excellent homogeneity with the dielectric present also suggests a solution to the problem. A spiral coil could be specially designed with a flexible bag of dielectric fluid that could conform to the top surface of the head. As taught by Wen et al., in an article entitled: "The Evaluation of Dielectric Resonators Containing $H_2O$ or $D_2O$ as RF Coils for High-Field MR Imaging and Spectroscopy," *Journal of Magnetic Resonance Series B*, Vol. 110, pp. 117–123 (1996), $D_2O$ could be used as an alternative to $H_2O$ to render the dielectric invisible. Varying the tightness of the spiral or the radius of the coil towards the top of the head might be an alternate solution.

Although one skilled in the art might be inclined to suggest that the spiral coil would be inefficient at producing transverse magnetic field compared to more standard designs, both the experimental and theoretical results argue otherwise. At high field strengths, resistive losses are dominated by the sample and sample losses are insensitive to axial wavenumber. Foo et al. reported a similar small difference in sample power deposition for coils with different axial wavenumbers. Though coil losses could possibly be greater with the spiral coil, they were not a major factor in the total losses of the spiral coil 10 as evidenced by the ratio of unloaded to loaded Q of 4.5. Simulations of power deposition were essentially one dimensional since they assumed cylindrical symmetry and infinite length. It is possible that incorporating realistic 3D geometries for the sample and the coil may alter the conclusions slightly. Three dimensional finite element methods as taught by Foo et al. may also be used to help optimize the homogeneity and power deposition of the spiral coil 10.

Those skilled in the art will appreciate that the spiral coil 10 of the invention provides a powerful method for eliminating finite wavelength related field inhomogeneity at higher field strengths. Since the wavelength increases approximately linearly with frequency while the skin depth increase as only the square root of frequency, the spiral coil should be able to eliminate the bulk of the field inhomogeneity at field strengths of 4 T or greater. This design should have a positive impact on the feasibility of high field imaging and spectroscopy of large samples.

Those skilled in the art will also appreciate that numerous other modifications to the invention are possible within the scope of the invention. For example, further developments for head imaging would include optimizing the pitch of the spiral, the components used in the coil construction, and providing means for compensating for signal drop off at the top of the head by including a dielectric pad at the end of the coil or varying the spiral pitch with position along the axis. Another development would be implementing a larger coil for body imaging at 4 Tesla or potentially even higher field strengths. Accordingly, the scope of the invention is not intended to be limited to the preferred embodiments described above, but only by any appended claims.

I claim:

1. A magnetic resonance imaging device, comprising:
    a cylindrical radio frequency (RF) coil having at least one conductor in a spiral geometry oriented around a center axis; and
    an RF coil driver which applies a current to the coil to produce a radio frequency field having a substantially uniform field amplitude and a phase variation along the center axis.

2. The device of claim 1, wherein the radio frequency coil comprises a plurality of conductors oriented at an angle relative to the center axis.

3. The device of claim 2, wherein each of the plurality of conductors is positioned at approximately the same angle relative to the center axis so that the phase variation of the radio frequency field is substantially linear.

4. The device of claim 2, wherein each conductor is separated from its adjacent conductor by a distance measured along the center axis such that the amount of phase variation is determined by the distance between adjacent conductors.

5. The device of claim 1, further comprising:
    a magnetic field generator which generates a magnetic field having a field strength of at least four Tesla.

6. A magnetic resonance imaging method for eliminating finite wavelength related field inhomogeneity at high field strength, comprising the steps of:
    providing a magnetic resonance imaging device comprising a cylindrical radio frequency coil having at least one conductor in a spiral geometry oriented at an orientation angle around a center axis;
    placing a sample within an interior region of the radio frequency coil along the center axis;
    applying a current to the radio frequency coil to produce a radio frequency field having a substantially uniform field amplitude and a phase variation along the center axis; and
    generating a magnetic resonance image of the sample based on the radio frequency field.

7. The method of claim 6, comprising the further step of varying the orientation angle to determine an optimal angle at which the radio frequency field along the center axis has a linear phase variation.

8. The method of claim 6, comprising the further step of varying the tightness of the coil to adjust the phase variation of the radio frequency field.

9. The method of claim 6, further comprising the step of applying to the sample a magnetic field having a field strength of at least four Tesla.

* * * * *

UNITED STATES PATENT AND TRADEMARK OFFICE
CERTIFICATE OF CORRECTION

PATENT NO. : 6,252,403 B1
DATED : June 26, 2001
INVENTOR(S) : David C. Alsop

It is certified that error appears in the above-identified patent and that said Letters Patent is hereby corrected as shown below:

<u>Column 6,</u>
Line 50, please delete the following equation:

$$B_m^{\pm} = \Omega_m \hat{x} \pm i\Omega_m \hat{y}$$

please replace with the following equation:

$$B_m^{\pm} = \Omega_m \hat{x} \pm i\Omega_m \hat{y}$$

Signed and Sealed this

Twenty-second Day of October, 2002

Attest:

Attesting Officer

JAMES E. ROGAN
*Director of the United States Patent and Trademark Office*